(12) United States Patent
Zang et al.

(10) Patent No.: US 10,403,734 B2
(45) Date of Patent: Sep. 3, 2019

(54) SEMICONDUCTOR DEVICE WITH REDUCED GATE HEIGHT BUDGET

(71) Applicant: GLOBALFOUNDRIES INC., Grand Cayman (KY)

(72) Inventors: Hui Zang, Guilderland, NY (US); Haigou Huang, Rexford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 44 days.

(21) Appl. No.: 15/656,542

(22) Filed: Jul. 21, 2017

(65) Prior Publication Data

US 2019/0027575 A1 Jan. 24, 2019

(51) Int. Cl.
| | |
|---|---|
| *H01L 29/51* | (2006.01) |
| *H01L 29/78* | (2006.01) |
| *H01L 29/66* | (2006.01) |
| *H01L 29/49* | (2006.01) |
| *H01L 21/762* | (2006.01) |

(52) U.S. Cl.
CPC ...... *H01L 29/518* (2013.01); *H01L 21/76224* (2013.01); *H01L 29/495* (2013.01); *H01L 29/66515* (2013.01); *H01L 29/66545* (2013.01); *H01L 29/7831* (2013.01)

(58) Field of Classification Search
CPC .............. H01L 29/518; H01L 21/76224
See application file for complete search history.

(56) References Cited

U.S. PATENT DOCUMENTS

| 7,892,956 B2* | 2/2011 | Deligianni ............ B82Y 10/00 257/E29.262 |
| 9,064,932 B1 | 6/2015 | Pham et al. |
| 9,390,979 B2 | 7/2016 | Wei et al. |
| 9,520,482 B1 | 12/2016 | Chang et al. |
| 2007/0141781 A1* | 6/2007 | Park .................. H01L 21/28273 438/257 |
| 2010/0237397 A1* | 9/2010 | Uchiyama ......... H01L 27/10876 257/306 |
| 2012/0126306 A1* | 5/2012 | Kawaguchi ........... H01L 21/764 257/319 |

OTHER PUBLICATIONS

Application and Drawings for U.S. Appl. No. 15/475,272, filed Mar. 31, 2017, 37 pages.

* cited by examiner

*Primary Examiner* — Wael M Fahmy
*Assistant Examiner* — Sarah K Salerno
(74) *Attorney, Agent, or Firm* — Francois Pagette; Andrew M. Calderon; Roberts Mlotkowski Safran Cole & Calderon, P.C.

(57) ABSTRACT

The present disclosure relates to semiconductor structures and, more particularly, to semiconductor device with reduced gate height budget and methods of manufacture. The method includes: forming a plurality of gate structures on a substrate; recessing material of the plurality of gate structures to below a surface of an insulator material; forming trenches in the insulator material and underlying material adjacent to sidewalls of the plurality of gate structures; and filling the recesses and trenches with a capping material.

19 Claims, 9 Drawing Sheets

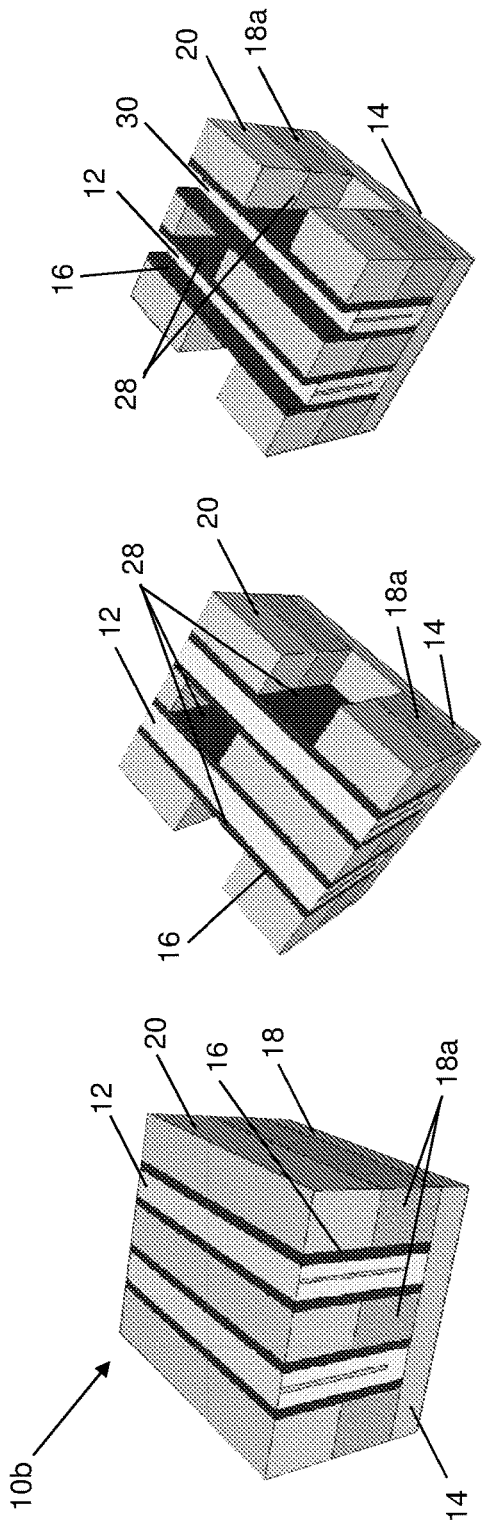

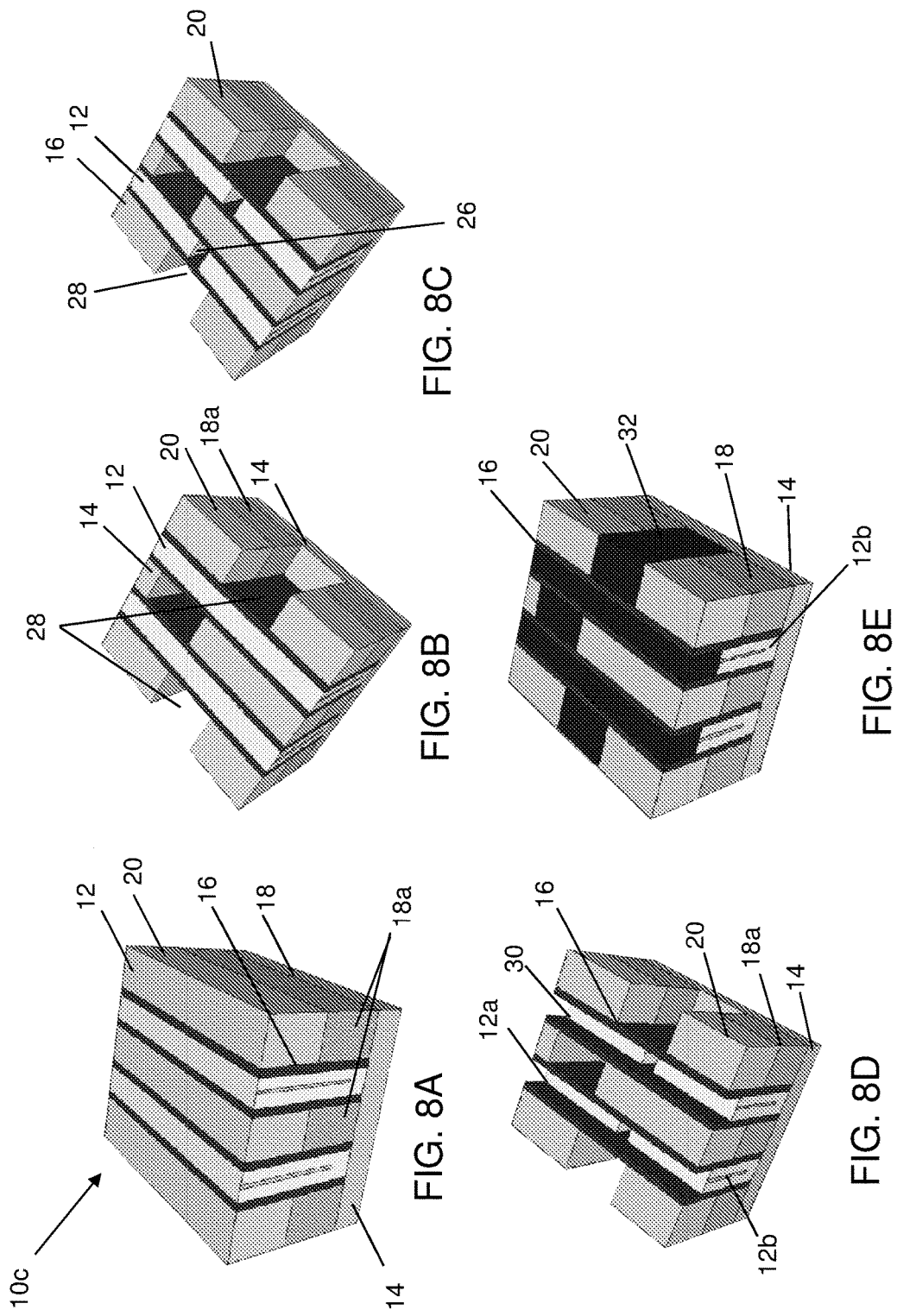

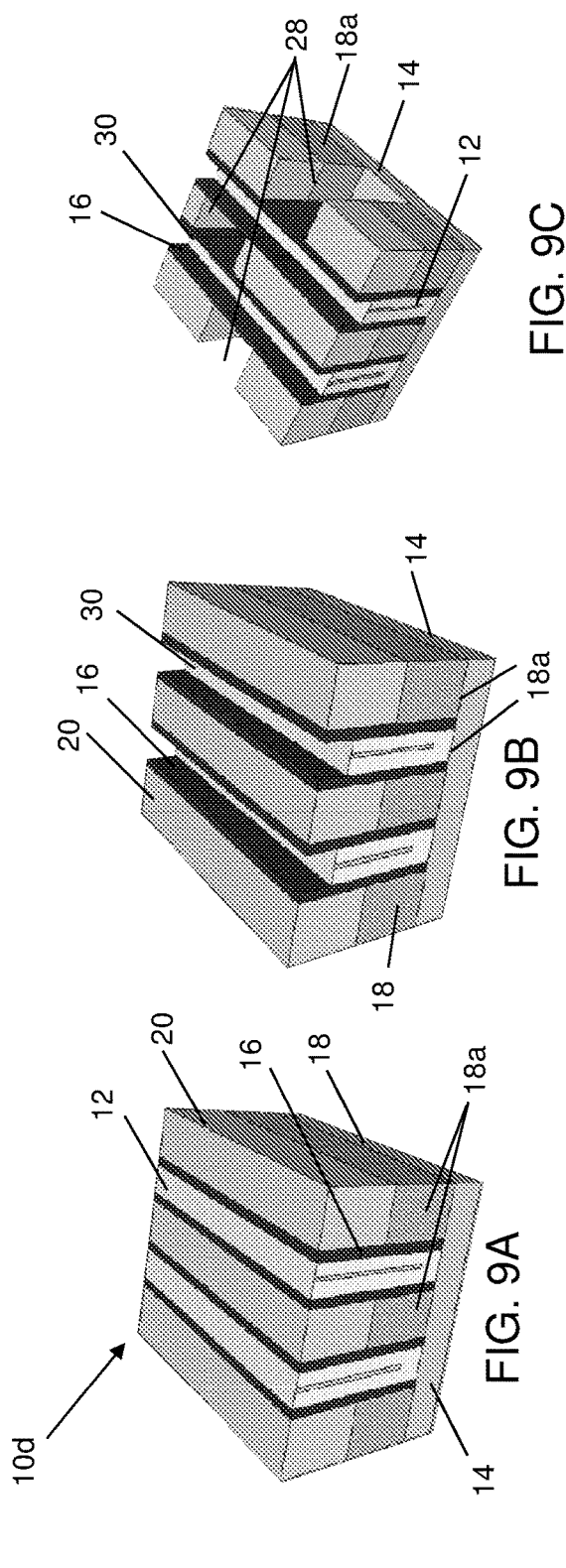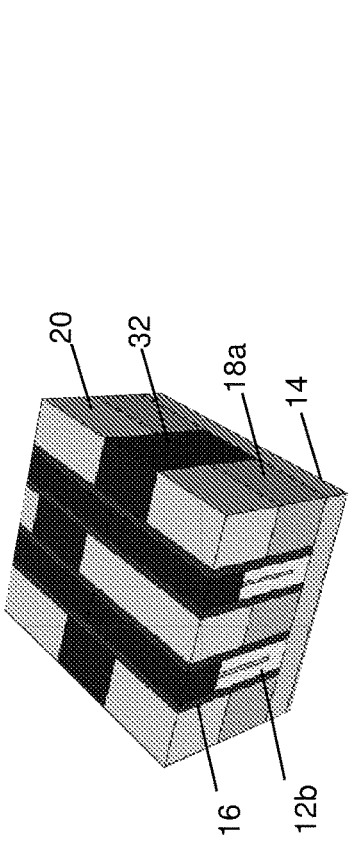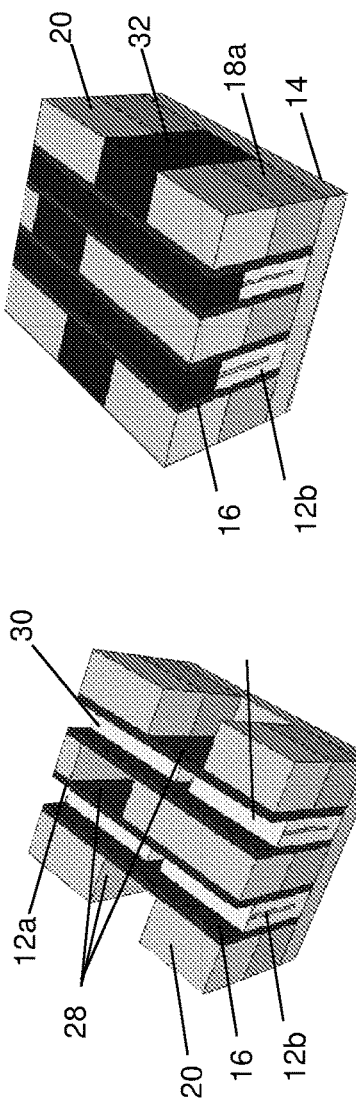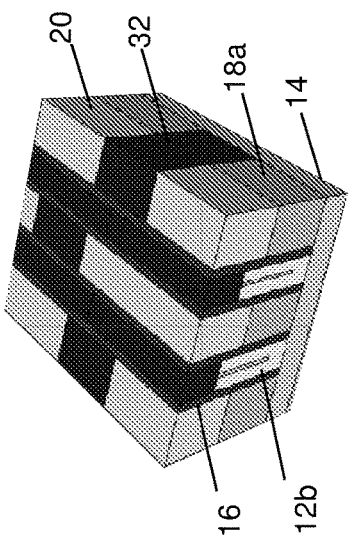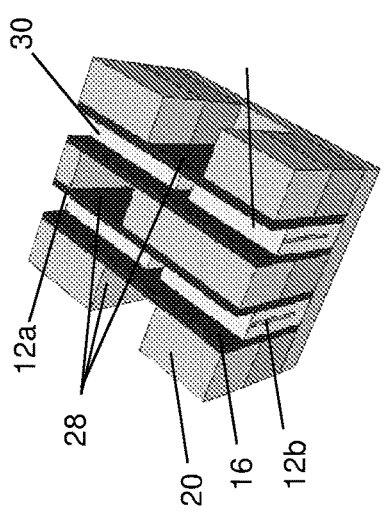

SEMICONDUCTOR DEVICE WITH REDUCED GATE HEIGHT BUDGET

FIELD OF THE INVENTION

The present disclosure relates to semiconductor structures and, more particularly, to semiconductor devices with reduced gate height budget and methods of manufacture.

BACKGROUND

Transistor scaling has been enabled by pitch scaling and other factors. For example, current scaling elements mainly focus on items that impact foot-print of the transistors, such as gate pitch, channel length, spacer thickness, contact critical dimension (CD), metal pitches and, for advanced technology, fin pitch. However, as the transistor further scales down to a gate pitch of about 50 nm and beyond, different factors (other than foot-print) start to play more significant roles. For example, initial gate height at the 50 nm and beyond starts to play a significant role in scaling.

A large budget (thick layer) of ILD may be needed for the initial gate height due to oxide material loss during dummy gate removal processes, e.g., using DHF chemistries, and cleaning processes which may damage the surface of the ILD. Moreover, it may be necessary to etch the oxide ILD with a chemistry selective to a gate cap material (e.g., SiN material); however, the oxide etch selectivity is not very good which results in additional oxide loss. Accordingly, due to this material loss, the initial height of the replacement gate structure needs to be very tall, which can result in bending and other fabrication issues.

SUMMARY

In an aspect of the disclosure, a method comprises: forming a plurality of gate structures on a substrate; recessing material of the plurality of gate structures to below a surface of an insulator material; forming trenches in the insulator material and underlying material adjacent to sidewalls of the plurality of gate structures; and filling the recesses and trenches with a capping material.

In an aspect of the disclosure, the method comprises: method comprising: forming gate material on a substrate; patterning the gate material to form a plurality of gate structures each of which include sidewall material formed on sidewalls thereof; recessing the gate material; forming trenches in the insulator material and an underlying poly material adjacent to the plurality of gate structures; and depositing a capping material in the recesses over the gate material and within the trenches.

In an aspect of the disclosure, a structure comprises: a plurality of recessed gate structures each of which include gate material and sidewall material formed on sidewalls of the gate material, the plurality of recessed gate structures separated from one another by a cut within the gate material; and a self-aligned capping material over the plurality of recessed gate structures, between the sidewall material, and within the cut and between poly material on sides of the sidewall material.

BRIEF DESCRIPTION OF THE DRAWINGS

The present disclosure is described in the detailed description which follows, in reference to the noted plurality of drawings by way of non-limiting examples of exemplary embodiments of the present disclosure.

FIGS. 7A-7E show structures and respective fabrication processes according to yet additional aspects of the present disclosure.

FIGS. 8A-8E show structures and respective fabrication processes according to further aspects of the present disclosure.

FIGS. 9A-9E show structures and respective fabrication processes according to additional aspects of the present disclosure.

DETAILED DESCRIPTION

The present disclosure relates to semiconductor structures and, more particularly, to semiconductor devices with reduced gate height budget and methods of manufacture. More specifically, the present disclosure provides a self aligned contact (SAC) and gate (PC) cut process package which reduces the planarization processes, e.g., chemical mechanical polishing (CMP) steps, significantly relaxing the gate height requirement. Advantageously, the processes described herein significantly reduces height loss and hence allows for a shorter initial gate height.

In embodiments, the SAC processes will reduce processing steps and gate height budget, compared to conventional processes. For example, by implementing the processes described herein, it is possible to have 30 nm or more gate height (oxide) budget savings. In embodiments, the gate height budget requirement is reduced since a gap filled CMP (e.g., formation of the gate structure with capping material) can be reduced from three steps (in conventional processes) to a single step described herein. For example, in embodiments, the processes described herein are varied, and encompass combining patterning and SAC processes with non-trench silicide (TS) pattern together with post gate CMP, e.g., tungsten gate polishing.

Advantageously, the processes described herein are significantly simplified for a lower cost and better yield margin than conventional processes. Further, device performance will be gained using low-K material, and gate to gate capacitance can be reduced. In embodiments, for example, device performance will be gained since low K material is used in the CT filled location and there is no boundary of replacement metal gate material. In addition, the device is free from such boundary induced metal in-complete fill, metal stress, or/and impact. The present scheme can also be used at long gate and wide drain/source cut locations due to low-k dielectric materials and SiCN used in the processes described herein.

The semiconductor device with reduced gate height budget of the present disclosure can be manufactured in a number of ways using a number of different tools. In general, though, the methodologies and tools are used to form structures with dimensions in the micrometer and nanometer scale. The methodologies, i.e., technologies, employed to manufacture the semiconductor device with reduced gate height budget of the present disclosure have been adopted from integrated circuit (IC) technology. For example, the structures are built on wafers and are realized in films of material patterned by photolithographic processes on the top of a wafer. In particular, the fabrication of the semiconductor device with reduced gate height budget uses three basic building blocks: (i) deposition of thin films of material on a substrate, (ii) applying a patterned mask on top of the films by photolithographic imaging, and (iii) etching the films selectively to the mask.

Figure 1:
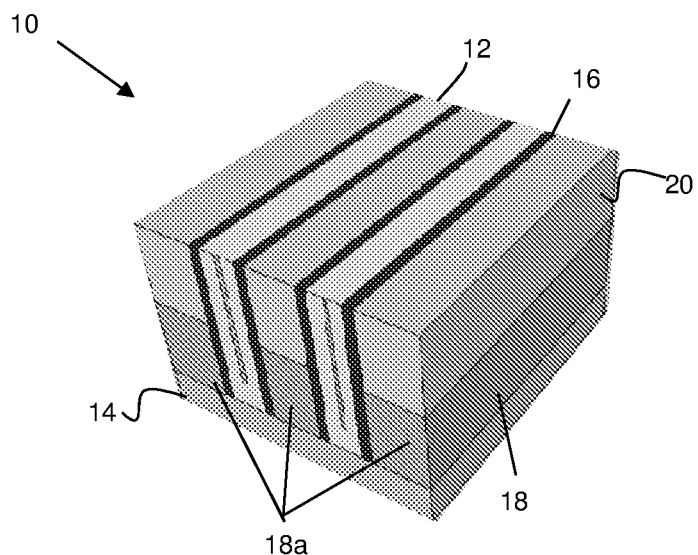
FIG. 1 shows an incoming structure and respective fabrication processes in accordance with aspects of the present disclosure.

FIG. 1 shows an incoming structure and respective fabrication processes in accordance with aspects of the present disclosure. In particular, the incoming structure 10 includes a gate structure 12 formed on an insulator material 14 (e.g., oxide material). In embodiments, the gate structure 12 comprises workfunction metals, e.g., tungsten gate material, and sidewalls 16. In embodiments, the gate structure 12 can be formed using a first gate process or a last gate replacement gate process as should be understood by those of skill in the art such that further explanation is not required herein for an understanding of the present disclosure. The workfunction metals, e.g., tungsten gate material, can be deposited to a thickness of about 30 nm and preferably about 28 nm; although other thicknesses are contemplated herein.

Still referring to FIG. 1, the sidewalls 16 can be composed of any sidewall material including a low-k dielectric material such as, e.g., nitride materials, oxide materials or a combination thereof. The sidewalls can be formed by conventional deposition and patterning processes, as is well known in the art. Raised source and drain regions 18a are formed using a poly material 18, on sides of the gate structure 12. In embodiments, the source and drain regions 18a can be formed by conventional ion implantation processes or in-situ doping as should be well understood by those of ordinary skill in the art. The poly material 18 can be of a thickness of 30 nm; although other thicknesses are contemplated herein.

The poly material 18 (as well as other materials deposited herein) can be deposited by a conventional deposition method. By way of example, the poly material 18 can be deposited using, e.g., chemical vapor deposition (CVD) processes. An interlevel dielectric material 20 is formed above the poly material, e.g., source and drain regions 16. In embodiments, the interlevel dielectric material 20 can be an oxide material, as an example. In embodiments, the interlevel dielectric material 20 can be initially deposited to a thickness of about 50 nm; although other thicknesses are contemplated herein. In embodiments, the initial height of the oxide material 20 will correspond with the height of replacement gate structure 12. It should be recognized, though, that by implementing the processes described in the aspects described herein, the large budget (thick layer) of ILD is significantly reduced, e.g., less oxide material loss occurs during the etching and cleaning processes described herein.

Figure 2A:
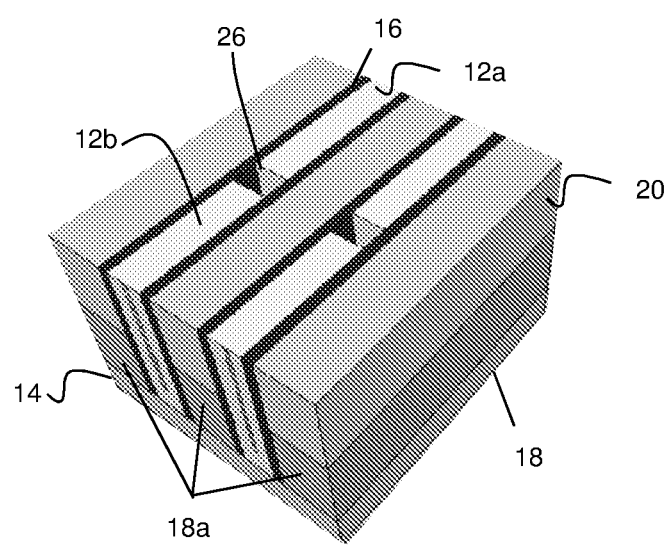
FIGS. 2A-2C show a patterned or cut gate structures and respective fabrication processes in accordance with aspects of the present disclosure.
Figure 2B:
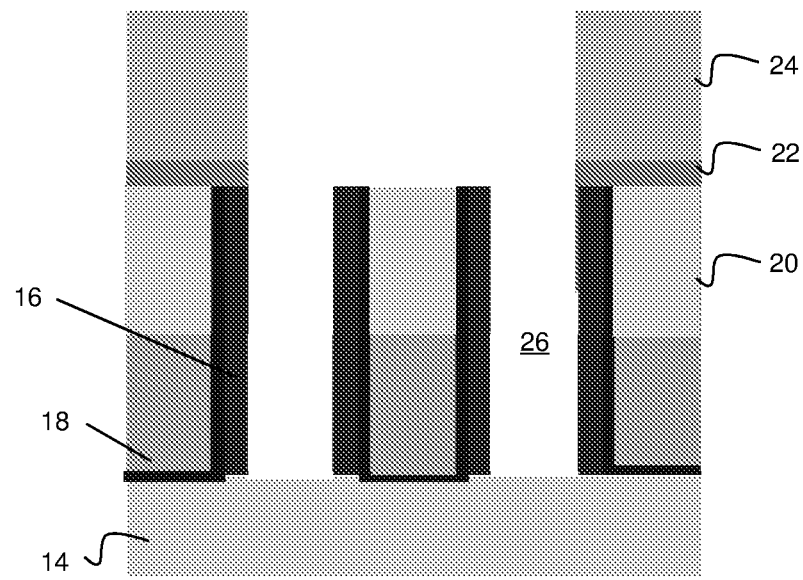
Figure 2C:
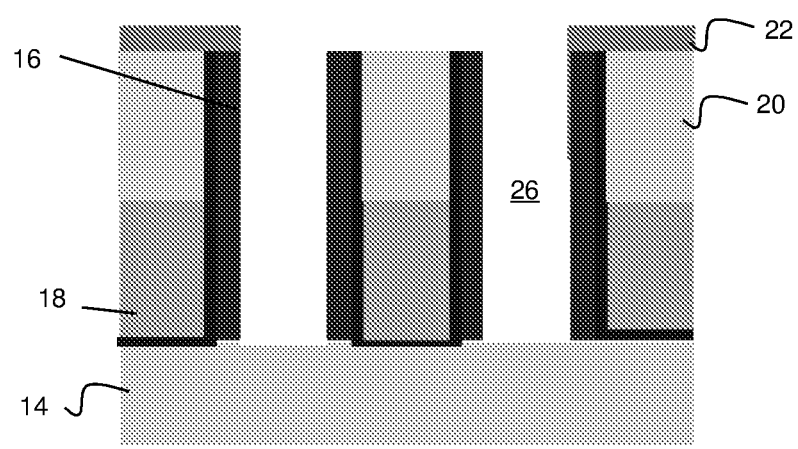

FIGS. 2A-2C show patterned or cut gate structures and respective fabrication processes in accordance with aspects of the present disclosure. Specifically, as shown in FIG. 2A, the gate structure 12 is cut or patterned to form separate gate structures 12a, 12b. As shown in FIG. 2B, a protective material 22, e.g., SiN, is formed on the surface of the structure of FIG. 1, and a lithographic stack 24 is formed on the protective material 22. The lithographic stack, e.g., resist, is exposed to energy (light) to form a pattern (opening). An etching process with a selective chemistry, e.g., reactive ion etching (RIE), will be used to form one or more trenches 26 through the opening(s), effectively removing gate material to form separate gate structures 12a, 12b.

As should be understood by those of skill in the art, the etching process will remove a portion of the protective material 22, between the trenches 26, which protected the oxide material 20 during the etching process. Also, in embodiments, the RIE chemistry will be a selective chemistry such that the sidewall material 16 will not be significantly, if at all, affected by the etching process. As shown in FIG. 2C, the resist can then be removed by a conventional oxygen ashing process or other known stripants.

Figure 3:
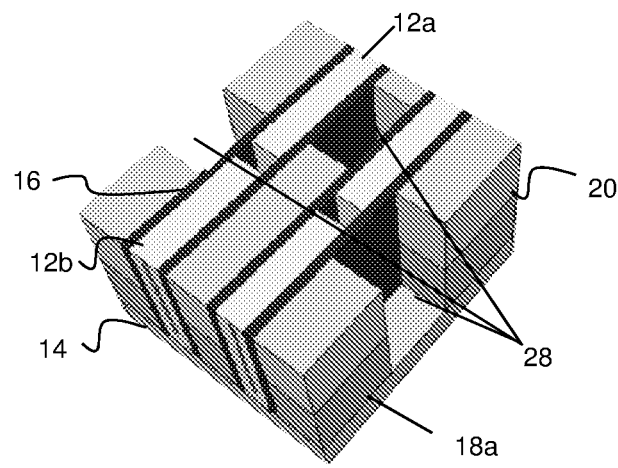
FIG. 3 shows a trench or opening in the poly material, remote from the source and drain regions and respective fabrication processes in accordance with aspects of the present disclosure.

In FIG. 3, the poly material and oxide material are patterned using conventional lithography process (e.g., exposure of resist to energy) and etching process (e.g., RIE). In embodiments, the patterning forms trenches or openings 28 in the poly material, remote from the source and drain regions 18a. In other words, the patterning does not affect the source and drain regions 18a. The patterning will also be selective to the poly material and oxide material, not significantly, if at all, affecting the sidewall material 16. In embodiments, the sidewall material 16 can also protect the gate structure 12 from being etched during this process.

Figure 4:
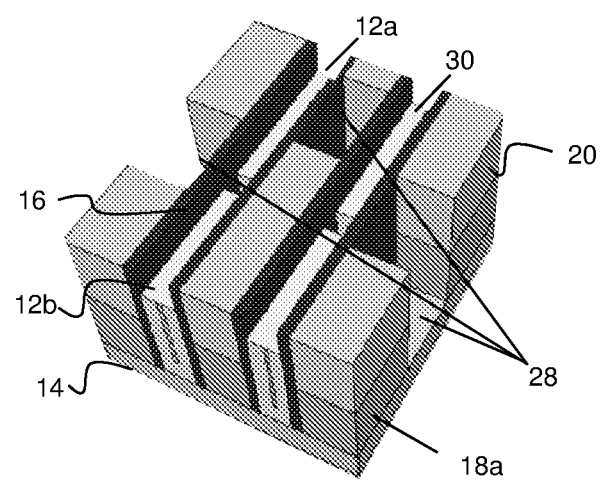
FIG. 4 shows a recessed gate structure and respective fabrication processes in accordance with aspects of the present disclosure.

In FIG. 4, the gate structures 12a, 12b can be slightly recessed. In embodiments, the recessing can be accomplished without a mask, e.g., lithographic stack. For example, the recess of the gate material, as depicted by reference numeral 30, can be formed by a dry etching process, as is known to those of skill in the art. For example, the use of a RIE process with fluorinated gas plasmas, e.g., $SF_6$, $CF_4$, $CHF_3$, mixed with oxygen, can achieve selective patterning of tungsten. The SiN film shown in FIG. 2C can also be stripped during this process. In embodiments, the gate structures 12a, 12b can be recessed by about 20 nm from an original gate height of about 110 nm, resulting in a final gate height of about 90 nm; although other dimensions are contemplated herein depending on the technology node and desired electrical properties.

Figure 5:
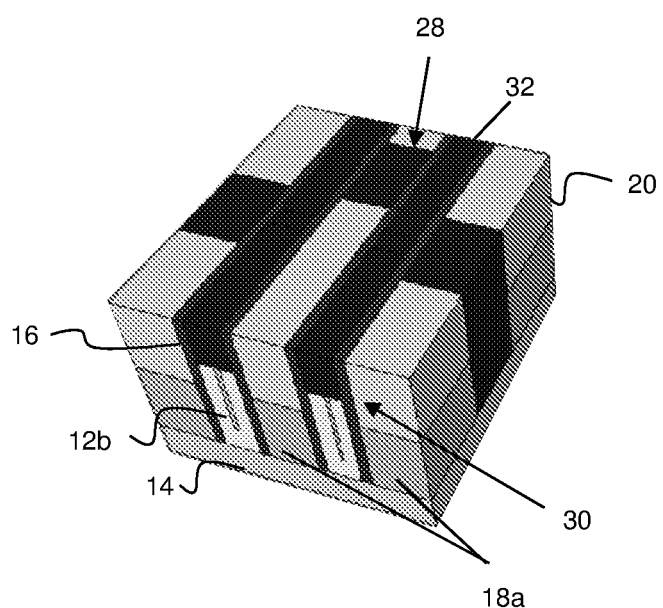
FIG. 5 shows material filling the recesses and trenches and respective fabrication processes in accordance with aspects of the present disclosure.

In FIG. 5, the recess 30 and the trenches 28 are filled with material 32, followed by a CMP process. In embodiments, the material 32 is a capping material which can be formed over the gate structures 12a, 12b and within the trenches 28. For example, the material 32 is SiOC and SiCN (SiN), as an example. Illustratively, SiOC is formed on all of the exposed sidewalls (e.g., sidewalls 16 of the gate structures 12a, 12b and sidewalls of the trenches 28) using an atomic layer deposition (ALD) process, followed by a deposition of SiCN using a conventional CVD process. In embodiments, the SiOC material can be about 12 nm to 20 nm thick; although other thicknesses are also contemplated herein. After the deposition process, any excess material can be removed by a conventional CMP process. Advantageously, as in all of the aspects described herein, in the processes described, the CMP process will only result in an approximate 30 nm and more specifically about 28.5 nm oxide budget loss, e.g., budget loss of the interlevel dielectric material 20. As should be understood by those of skill in the art, the SiCN material will act as a capping material on the gate structures 12a, 12b.

Figure 6C:
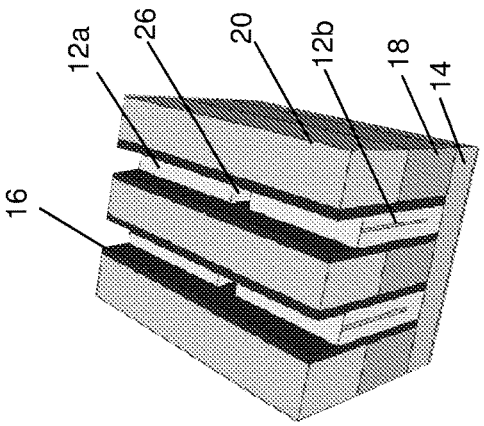
FIGS. 6A-6E show structures and respective fabrication processes according to additional aspects of the present disclosure.
Figure 6B:
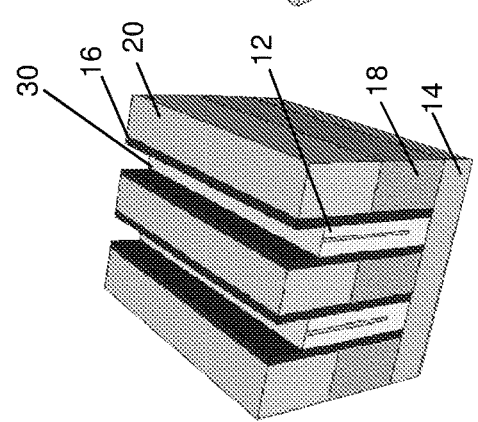
Figure 6E:
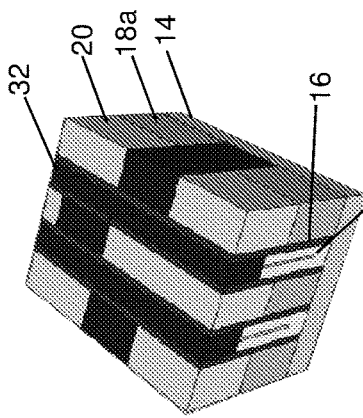
Figure 6A:
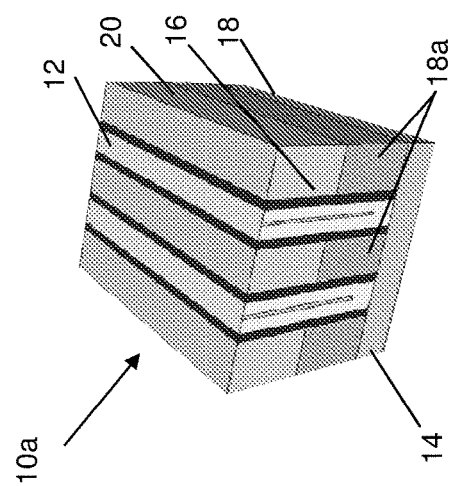

FIGS. 6A-6E show structures and respective fabrication processes according to additional aspects of the present disclosure. Specifically, FIG. 6A shows an incoming structure 10a which includes the gate structure 12 formed on an insulator material 14 (e.g., oxide material), similar to that described with respect to FIG. 1. Still referring to FIG. 6A, sidewalls 16 are formed on the gate structure 12, composed of any sidewall material including a low-k dielectric material such as, e.g., nitride materials, oxide materials or a combination thereof. Raised source and drain regions 18a are formed from the poly material 18, on sides of the gate structure 12 using conventional ion implantation processes or in-situ doping.

In FIG. 6B, the gate structure 12 can be slightly recessed. In embodiments, the recessing can be accomplished without a mask, e.g., lithographic stack, as described with respect to FIG. 4. For example, the recess of the gate material, as depicted by reference numeral 30, can be formed by a dry etching process as is known to those of skill in the art. In embodiments, the gate structure 12 can be recessed by about 20 nm from an original gate height of about 110 nm, resulting in a final gate height of about 90 nm; although other dimensions are contemplated herein depending on the technology node and desired electrical properties.

In FIG. 6C, the gate structure 12 is cut or patterned to form separate gate structures 12a, 12b. As an example, a protective material, e.g., SiN, is formed on the surface of the structure of FIG. 6B, and a lithographic stack is formed on the protective material. The lithographic stack, e.g., resist, is exposed to energy (light) to form a pattern (opening). An etching process with a selective chemistry, e.g., RIE, will be used to form one or more trenches 26 through the opening (s), effectively removing gate material to form separate gate structures 12a, 12b. In embodiments, the RIE chemistry will be a selective chemistry such that the sidewall material 16 will not be significantly, if at all, affected by the etching process. The resist can then be removed by a conventional oxygen ashing process or other known stripants.

Figure 6D:
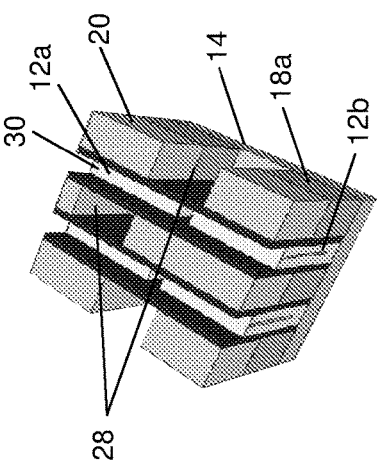

In FIG. 6D, the poly material 18 and oxide material 20 are patterned using conventional lithography process (e.g., exposure of resist to energy) and etching process (e.g., RIE). In embodiments, the patterning forms trenches or openings 28 in the poly material, remote from the source and drain regions 18a. In other words, the patterning does not affect the source and drain regions 18a. The patterning will also be selective to the poly material and oxide material, not significantly, if at all, affecting the sidewall material 16. In embodiments, the sidewall material 16 can also protect the gate structure 12 from being etched during this process.

In FIG. 6E, the recess 30 and the trenches 28 are filled with material 32, followed by a CMP process. In embodiments, the material 32 is a capping material which can be formed over the gate structures 12a, 12b and within the trenches 28. As should be understood by those of skill in the art, the SiCN material will act as a capping material on the gate structures 12a, 12b. In embodiments, the material 32 is SiOC and SiCN, as an example. Illustratively, SiOC is formed on all of the exposed sidewalls (e.g., sidewalls 16 of the gate structures 12a, 12b and sidewalls of the trench 28) using an atomic layer deposition (ALD) process, followed by a deposition of SiCN using a conventional CVD process. In embodiments, the SiOC material can be about 12 nm to 20 nm thick; although other dimensions are also contemplated herein. After the deposition process, any excess material can be removed by a conventional CMP process. Advantageously, as in all of the aspects described herein, in the processes described, the CMP process will only result in an approximate 30 nm and more specifically about 28.5 nm oxide budget loss, e.g., budget loss of the interlevel dielectric material 20.

FIGS. 7A-7E show structures and respective fabrication processes according to additional aspects of the present disclosure. Specifically, FIG. 7A shows an incoming structure 10b which includes the gate structure 12 formed on an insulator material 14 (e.g., oxide material), similar to that described with respect to FIG. 1. Still referring to FIG. 7A, sidewalls 16 are formed on the gate structure 12, composed of any sidewall material including a low-k dielectric material such as, e.g., nitride materials, oxide materials or a combination thereof. Raised source and drain regions 18a are formed using a poly material 18 with conventional ion implantation processes or in-situ doping.

In FIG. 7B, the poly material 18 and oxide material 20 are patterned using conventional lithography process (e.g., exposure of resist to energy) and etching process (e.g., RIE). In embodiments, the patterning forms trenches or openings 28 in the poly material, remote from the source and drain regions 18a. The patterning will be selective to the poly material and oxide material, not significantly, if at all, affecting the sidewall material 16. In embodiments, the sidewall material 16 can also protect the gate structure 12 from being etched during this process.

In FIG. 7C, the gate structure 12 can be slightly recessed. In embodiments, the recessing can be accomplished without a mask, e.g., lithographic stack, as described with respect to FIG. 4. For example, the recess of the gate material, as depicted by reference numeral 30, can be formed by a dry etching process, as is known to those of skill in the art. In embodiments, the gate structure 12 can be recessed by about 20 nm from an original gate height of about 110 nm, resulting in a final gate height of about 90 nm; although other dimensions are contemplated herein depending on the technology node and desired electrical properties.

In FIG. 7D, the recessed gate structure 12 is cut or patterned to form separate gate structures 12a, 12b as already described herein. For example, an etching process with a selective chemistry, e.g., reactive ion etching (RIE), will be used to form one or more trenches 26 through the opening in a lithographic stack, effectively removing gate material to form separate gate structures 12a, 12b.

In FIG. 7E, the recess 30 and the trenches 28 are filled with material 32, followed by a CMP process. In embodiments, the material 32 is a capping material which can be formed over the gate structures 12a, 12b and within the trenches 28. In embodiments, the material 32 is SiOC and SiCN, as an example. Illustratively, SiOC is formed on all of the exposed sidewalls (e.g., sidewalls 16 of the gate structure 12 and sidewalls of the trench 28) using an atomic layer deposition (ALD) process, followed by a deposition of SiCN using a conventional CVD process. In embodiments, the SiOC material can be about 12 nm to 20 nm thick; although other dimensions are also contemplated herein. After the deposition process, any excess material can be removed by a conventional CMP process. Advantageously, as in all of the aspects described herein, in the processes described, the CMP process will only result in an approximate 30 nm and more specifically about 28.5 nm oxide budget loss, e.g., budget loss of the interlevel dielectric material 20.

FIGS. 8A-8E show structures and respective fabrication processes according to additional aspects of the present disclosure. Specifically, FIG. 8A shows an incoming structure 10c which includes the gate structure 12 formed on an insulator material 14 (e.g., oxide material), similar to that described with respect to FIG. 1. Still referring to FIG. 8A, sidewalls 16 are formed on the gate structure 12, composed of any sidewall material including a low-k dielectric material such as, e.g., nitride materials, oxide materials or a combination thereof. Raised source and drain regions 18*a* are formed using a poly material 18 by conventional ion implantation processes or in-situ doping.

In FIG. 8B, the poly material 18 and oxide material 20 are patterned using conventional lithography process (e.g., exposure of resist to energy) and etching process (e.g., RIE). In embodiments, the patterning forms trenches or openings 28 in the poly material, remote from the source and drain regions 18*a*. The patterning will be selective to the poly material and oxide material, not significantly, if at all, affecting the sidewall material 16. In embodiments, the sidewall material 16 can also protect the gate structure 12 from being etched during this process.

In FIG. 8C, the gate structure 12 is cut or patterned to form separate gate structures 12*a*, 12*b* as already described herein. In FIG. 8D, the gate structures 12*a*, 12*b* can be slightly recessed without the need for a mask, e.g., lithographic stack, as described with respect to FIG. 4. In embodiments, the gate structures 12*a*, 12*b* can be recessed by about 20 nm from an original gate height of about 110 nm, resulting in a final gate height of about 90 nm; although other dimensions are contemplated herein depending on the technology node and desired electrical properties.

In FIG. 8E, the recess 30 and the trenches 28 are filled with material 32, followed by a CMP process. In embodiments, the material 32 is a capping material which can be formed over the gate structures 12*a*, 12*b* and within the trenches 28. In embodiments, the material 32 is SiOC and SiCN, as an example. Illustratively, SiOC is formed on all of the exposed sidewalls (e.g., sidewalls 16 of the gate structure 12 and sidewalls of the trench 28) using an atomic layer deposition (ALD) process, followed by a deposition of SiCN using a conventional CVD process. In embodiments, the SiOC material can be about 12 nm to 20 nm thick; although other dimensions are also contemplated herein. After the deposition process, any excess material can be removed by a conventional CMP process. Advantageously, as in all of the aspects described herein, in the processes described, the CMP process will only result in an approximate 30 nm and more specifically about 28.5 nm oxide budget loss, e.g., budget loss of the interlevel dielectric material 20.

FIGS. 9A-9E show structures and respective fabrication processes according to additional aspects of the present disclosure. Specifically, FIG. 9A shows an incoming structure 10*d* which includes the gate structure 12 formed on an insulator material 14 (e.g., oxide material), similar to that described with respect to FIG. 1. Still referring to FIG. 9A, sidewalls 16 are formed on the gate structure 12, composed of any sidewall material including a low-k dielectric material such as, e.g., nitride materials, oxide materials or a combination thereof. Raised source and drain regions 18*a* are formed using a poly material 18 by conventional ion implantation processes or in-situ doping.

In FIG. 9B, the gate structure 12 can be slightly recessed without the need for a mask, e.g., lithographic stack, as described with respect to FIG. 4. In embodiments, the gate structure 12*a* can be recessed by about 20 nm from an original gate height of about 110 nm, resulting in a final gate height of about 90 nm; although other dimensions are contemplated herein depending on the technology node and desired electrical properties.

In FIG. 9C, the poly material 18 and oxide material 20 are patterned using conventional lithography process (e.g., exposure of resist to energy) and etching process (e.g., RIE). In embodiments, the patterning forms trenches or openings 28 in the poly material, remote from the source and drain regions 18*a*. The patterning will be selective to the poly material and oxide material, not significantly, if at all, affecting the sidewall material 16. In embodiments, the sidewall material 16 can also protect the gate structure 12 from being etched during this process.

In FIG. 9D, the gate structure 12 is cut or patterned to form separate gate structures 12*a*, 12*b* as already described herein. In FIG. 9E, the recess 30 and the trenches 28 are filled with material 32, followed by a CMP process. In embodiments, the material 32 is a capping material which can be formed over the gate structures 12*a*, 12*b* and within the trenches 28. In embodiments, the material 32 is SiOC and SiCN, as an example. Illustratively, SiOC is formed on all of the exposed sidewalls (e.g., sidewalls 16 of the gate structure 12 and sidewalls of the trench 28) using an atomic layer deposition (ALD) process, followed by a deposition of SiCN using a conventional CVD process. In embodiments, the SiOC material can be about 12 nm to 20 nm thick; although other dimensions are also contemplated herein. After the deposition process, any excess material can be removed by a conventional CMP process. Advantageously, as in all of the aspects described herein, in the processes described, the CMP process will only result in an approximate 30 nm and more specifically about 28.5 nm oxide budget loss, e.g., budget loss of the interlevel dielectric material 20.

The above noted processes provide an approximately 30 nm gate height budget savings compared to conventional processes of record. For example, as shown in the table 1, below, the above noted processes provide the following budget savings, compared to conventional 7 nm POR flows.

TABLE 1

|  | 7 nm Conventional flow | Scheme of the Present Disclosure |
|---|---|---|
| Gate Cut Module | 13 nm | 0 |
| Poly Pull Process | 1.5 nm | 1.5 nm |
| oxide remove (dHF and chemical oxide removal) | 12 nm | 12 nm |
| Tungsten gate CMP | 0 | 0 |
| Cap SiN CMP | 10 nm | 0 |
| Source/Drain stack RIE | 15 nm | 0 |
| Source/Drain cut filled CMP | 10 nm | 15 nm |
| Total Loss | 61.5 | 28.5 nm |

Figure 10:
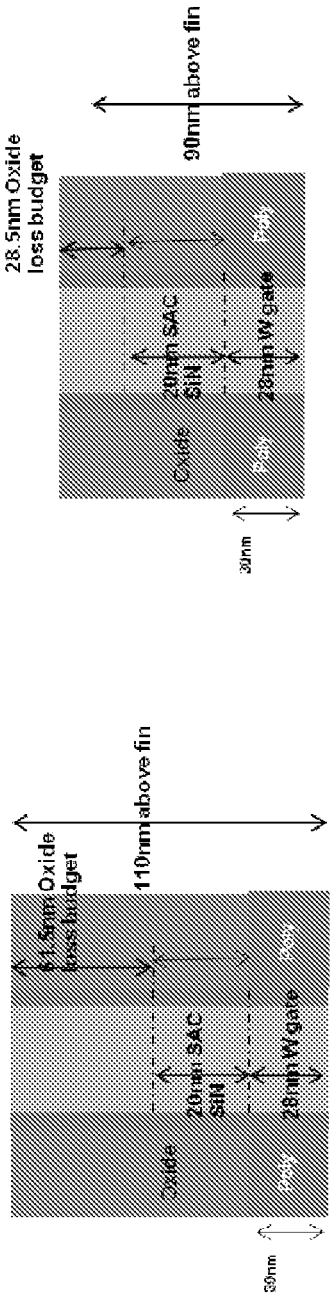
FIG. 10 shows a comparison of gate height budget between a conventional process and the processes described herein.

FIG. 10 shows a comparison of gate height budget between a conventional process and the processes described herein. It should be recognized that the dimensions provided in this comparison are non-limiting illustrative examples. As shown in this comparison, the processes described in the present disclosure will provide a budget savings of 28.5 nm.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   forming a plurality of gate structures over a substrate;
   forming sidewalls on the plurality of gate structures;
   recessing gate material of the plurality of gate structures to below a surface of an insulator material and a top surface of the sidewalls;
   forming trenches in the insulator material and underlying material adjacent to the sidewalls of the plurality of gate structures which exposes the substrate; and
   filling the recesses and trenches with a capping material, wherein:
   the underlying material is poly material that is deposited on the substrate after forming of the plurality of gate structures by a patterning process;
   the insulator material is deposited on the poly material;
   the forming of the trenches in the poly material and the insulator material exposes the sidewalls of the plurality of gate structures, on a side thereof opposing the plurality of gate structures; and
   the filling of the recesses and trenches is a complete filling of the recesses and trenches with a same material in a same deposition process, followed by a planarization process.

2. The method of claim 1, wherein the forming of the plurality of gate structures comprises providing a cut in the gate material.

3. The method of claim 2, wherein the filling of the recesses and the trenches comprises deposition of the capping material over the gate structures and within the cut such that the recesses and the trenches are completely filled, followed by a planarization process.

4. The method of claim 3, wherein the sidewalls protect the gate material during etching processes to form the trenches.

5. The method of claim 1, wherein the plurality of gate structures are formed prior to the trenches, and the trenches are formed prior to the recessing.

6. The method of claim 1, wherein the recessing is provided prior to the forming of the plurality of gate structures and the plurality of gate structures is provided prior to the trenches.

7. The method of claim 1, wherein the trenches are provided prior to the recessing and the recessing is provided prior to the forming of the plurality of gate structures.

8. The method of claim 1, wherein the trenches are formed prior to the forming of the plurality of gate structures and the recessing is provided after the forming of the plurality of gate structures.

9. The method of claim 1, wherein the recessing is provided prior to the forming of the trenches and the trenches are formed prior to the forming of the plurality of gate structures.

10. The method of claim 1, wherein the capping material is self aligned gap fill material, followed by a chemical mechanical planarization process.

11. The method of claim 1, wherein the sidewalls are a low-k dielectric material.

12. A method comprising:
    forming gate material on a substrate;
    patterning the gate material to form a plurality of gate structures;
    forming sidewall material on sidewalls of the plurality of gate structures;
    forming poly material on the substrate and insulator material on the poly material, both adjacent to the sidewall material of the plurality of gate structures;
    recessing the gate material between the sidewall material;
    forming trenches in the insulator material and the poly material adjacent to the sidewall material of the plurality of gate structures; and
    depositing a capping material of a same material in the recesses over the gate material and within the trenches.

13. The method of claim 12, wherein the patterning is an etching process to cut the gate material, while the sidewall material remains intact.

14. The method of claim 12, wherein the depositing of the capping material is provided in a cut between the patterned gate structures.

15. The method of claim 12, wherein:
    the forming of the trenches comprises an etching process through the insulator material and the underlying poly material, and
    the sidewall material protects the gate material during the etching.

16. The method of claim 12, wherein the capping material is self aligned gap fill material comprising SiOC and SiN material.

17. The method of claim 12, wherein the sidewall material is a low-k dielectric material.

18. The method of claim 12, wherein the patterning of the gate structures are provided prior to the trenches, and the trenches are formed prior to the recessing.

19. The method of claim 12, wherein:
    the poly material is deposited directly on the substrate after patterning of the plurality of gate structures;
    the insulator material is deposited directly on the poly material;
    the forming of the trenches in the poly material and the insulator material exposes the sidewalls of the plurality of gate structures, on a side thereof opposing the plurality of gate structures; and
    the depositing of the capping material in the recesses and trenches is a complete filling of the recesses and trenches with a same deposition process, followed by a planarization process.

* * * * *